United States Patent [19]

Herdt et al.

[11] Patent Number: 5,563,839
[45] Date of Patent: Oct. 8, 1996

[54] SEMICONDUCTOR MEMORY DEVICE HAVING A SLEEP MODE

[75] Inventors: Christian E. Herdt, Monument; Albert S. Weiner, Colorado Springs, both of Colo.

[73] Assignee: Simtek Corporation, Colorado Springs, Colo.

[21] Appl. No.: 413,360

[22] Filed: Mar. 30, 1995

[51] Int. Cl.$^6$ .................................................. C11C 7/00
[52] U.S. Cl. ........................................ 365/227; 365/229
[58] Field of Search .................................. 365/226, 227, 365/228, 229

[56] References Cited

U.S. PATENT DOCUMENTS

| | | | |
|---|---|---|---|
| 4,758,945 | 7/1988 | Remedi | 364/200 |
| 4,984,211 | 1/1991 | Tran | 365/229 |
| 5,121,359 | 6/1992 | Steele | 365/229 |
| 5,262,998 | 11/1993 | Mnich et al. | 365/227 |
| 5,345,424 | 6/1994 | Landgraf | 365/227 |

OTHER PUBLICATIONS

Simtek Data Book, Mar. 7, 1994, pp. 1–14.

*Primary Examiner*—Tan T. Nguyen
*Attorney, Agent, or Firm*—Sheridan Ross & McIntosh

[57] ABSTRACT

The present invention provides a computer memory device having a sleep mode characterized by extremely low current consumption and relatively large turn on delay. The invention includes circuitry for disabling current sinking elements internal to said device in response to a sleep signal. In one embodiment, the invention includes circuitry for disconnecting the bit lines and memory cell loads of a nonvolatile static random access memory (nvSRAM) array from a source of power in response to a sleep signal. This embodiment is capable of first transferring the data stored in a volatile portion of the array to a nonvolatile portion of the array before entering sleep mode to prevent loss of the data.

30 Claims, 4 Drawing Sheets

SEMICONDUCTOR MEMORY DEVICE HAVING A SLEEP MODE

FIELD OF THE INVENTION

The present invention relates generally to computer memory devices, and, more particularly, to computer memory devices having a low current sleep mode.

BACKGROUND OF THE INVENTION

A computer memory is a storage device that receives, retains and transmits digital information in a computer. Computer memories come in many different types which vary according to how long they can store data, how fast they are able to receive and transmit data, and how much they cost, among other things. The present invention is applicable to many different types of computer memory, such as read only memory (ROM) and random access memory (RAM), but in the preferred embodiment the invention concerns a subset of RAM known as static random access memory (SRAM).

A random access memory is generally comprised of an array of data storage locations, known as memory cells, where individual data elements, known as bits, can be retained. Each data storage location is addressable so that data from the exterior environment can be written into the data storage location, or data can be read from the data storage location and provided to the exterior environment. The time it takes to access the data in any particular storage location, i.e., at a particular address, is substantially independent of the particular address of that location, hence the name random access memory.

The word "static" in static random access memory refers to the ability of the memory to retain data without having to constantly refresh or re-write the memory cells. The opposite of this is a "dynamic" random access memory which requires constant refreshing of the memory cells to maintain the data contained therein.

An important characteristic of any computer memory device is whether the device is volatile or nonvolatile. A volatile memory device, such as an SRAM, will lose all of its stored data if the power being supplied to the device is terminated. A nonvolatile memory, in contrast, will retain its data even if power is removed. In general, nonvolatile memory devices operate much slower than volatile devices performing the same functions, and, therefore, are not generally used in applications requiring both fast read and write operations.

Memory devices exist which combine a faster volatile memory portion with a slower nonvolatile memory portion to obtain the benefits of both types of memory. These devices use the volatile memory portion during high speed operation and transfer the data stored in the volatile portion to the nonvolatile portion if there is concern that power to the nonvolatile portion will be lost. The data so transferred can later be recalled to the volatile portion when needed. Devices having these characteristics are generally called nonvolatile static random access memories (nvSRAMs).

Nonvolatile SRAMs have wide applicability in the computer industry and may be used in many different computer based products. Such memories may be used, for example, in portable laptop computers or other portable computer products. A problem which arises when these memories are used in portable computers is the sizable current drain that they create even when not in use or in a current reduction mode known as the standby mode. This current drain tends to deplete the computer's battery and results in significantly less operating time between recharges.

Therefore, a need exists for an nvSRAM device that is capable of conserving more power than nvSRAMs with standby current reduction.

SUMMARY OF THE INVENTION

The invention is concerned with a computer memory device having a low current operating mode, called a sleep mode. This mode is achieved by disabling, or turning off, current sinking elements internal to the memory device in response to a sleep signal. Among the current sinking elements disabled are elements that require more time to reach an operational state after power is applied to the memory than the normal address access time of the memory. By disabling these elements, the invention is capable of reducing the current consumed by the memory to levels that make the device particularly useful in those applications which require reduced power consumption.

In the preferred embodiment, the invention includes a nonvolatile static random access memory (nvSRAM) cell having both a static random access memory (SRAM) portion and a nonvolatile portion. Both portions are capable of retaining a digital data bit delivered to them, but the SRAM portion will lose its retained data bit if power to the cell is removed while the nonvolatile portion will not lose its retained data bit if power to the cell is removed. The nvSRAM cell is capable of transferring a bit of data from the SRAM portion to the nonvolatile portion in response to a store signal and transferring a bit of data from the nonvolatile portion to the SRAM portion in response to a recall signal.

The nvSRAM cell of the preferred embodiment has at least one memory cell load operatively connected thereto for facilitating the delivery of power to the cell. This memory cell load sinks current whenever a voltage is applied to it. To avoid this current sinking, the invention is capable of disconnecting the load from a source of power in response to a sleep signal. Because the data retained within the SRAM portion of the nvSRAM cell will be lost when the voltage is removed from the memory cell load, the preferred embodiment of the invention allows a user to deliver a store signal to the cell before entering the sleep mode. This causes a transfer of the data from the SRAM portion to the nonvolatile portion, thereby protecting the data from loss. In an alternative embodiment, the invention automatically delivers a store signal to the nvSRAM cell whenever sleep mode is entered.

The nvSRAM cell of the preferred embodiment also has at least one bit line operatively connected thereto for providing a pathway for data between the cell and the exterior environment. Any time a voltage is present on this bit line, a semiconductor junction will be reverse biased and a small leakage current to an underlying substrate will result. The invention is capable of disconnecting the bit line from a source of power in response to a sleep signal. In a preferred embodiment, the invention is capable of holding the bit line at the same voltage level as the underlying substrate in response to a sleep signal.

The preferred embodiment of the invention also includes power monitoring circuitry for monitoring the power being supplied to the device. The power monitoring circuitry is capable of creating a store signal when there is a loss of power being supplied to the device and a recall signal when the power being supplied to the device is restored. The invention provides circuitry for deactivating, in response to a sleep signal, many of the current sinking elements internal to the power monitoring circuitry.

Lastly, the preferred embodiment of the present invention includes at least one input buffer for buffering signals being transmitted into the nvSRAM device. The input buffer is known to sink current whenever the input signal being applied to it is at an intermediate level between power supply and ground. The invention provides circuitry for disabling the input buffers in response to a sleep signal.

Based on the foregoing, the present invention is capable of significantly reducing the power consumed by the nvSRAM device whenever a sleep signal is supplied to the device from an external source.

DETAILED DESCRIPTION

The invention is concerned with a computer memory device having a low current operating mode, called a sleep mode. This mode is achieved by disabling, or turning off, current sinking elements internal to the memory device in response to a sleep signal. Among the current sinking elements disabled are elements that require more time to reach an operational stated after power is applied to the memory, than the normal address access time of the memory. By disabling these elements, the invention is capable of reducing the current consumed by the memory to levels below those achieved by the prior art standby mode and is particularly useful in those situations when immediate access to the memory cells is not critical.

Figure 1:
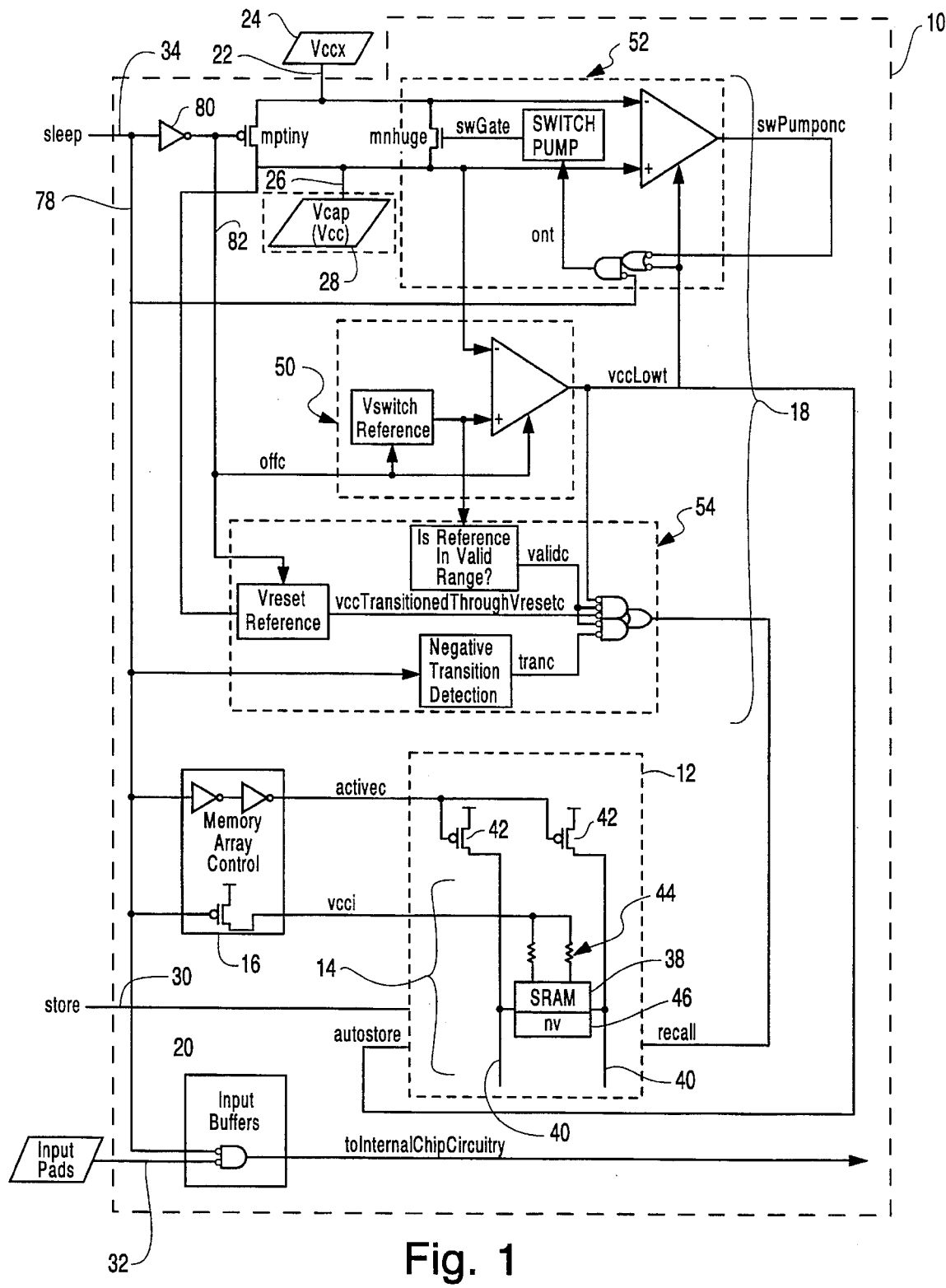
FIG. 1 is a schematic diagram of the present invention.

FIG. 1 illustrates an embodiment of the invention and, more specifically, an nvSRAM device with sleep mode capability, which is hereinafter referred to as device 10. For ease of description and to enhance understanding, FIG. 1 is broken down into three separate portions in FIGS. 2, 3, and 4.

As seen in FIGS. 1–4, device 10 includes nonvolatile static random access memory (nvSRAM) array 12 with one nvSRAM memory cell 14 thereof illustrated. To control the application of power to the array, among other things, the device includes a memory array control 16. The device 10 further includes power monitoring circuitry 18 that operates so that if the power being provided to the device 10 is inadequate for retaining data in the SRAM portion of the array 12, a store operation is initiated that causes the data in the SRAM portion of the array 12 to be transferred to the nonvolatile portion of the array 12. In addition, the power monitoring circuitry 18 can initiate a recall operation that causes data previously stored in the nonvolatile portion of the array 12 to be transferred to the SRAM portion of the array 12 when the power being provided to the device 10 transitions from an inappropriate level for SRAM operation to an acceptable level for SRAM operation. The device 10 further includes input buffers 20 for use in transferring data from the exterior environment to the device 10.

To interface the device 10 with the exterior environment, the device includes a plurality of inputs. Specifically, the device 10 includes a power input 22 for providing power from a power supply 24 to the device 10. Backup power input 26 provides power from an external capacitor 28 that can be used, in the event the power supply 24 fails, to accomplish a store operation. A store input 30 permits a user to force a store operation to occur in the array 12. The device also includes input pads 32 to facilitate the transfer of data, including clocks, addresses, and user input data, from the exterior environment to the input buffers 20. A sleep input 34 is provided to permit a user to place the device in the sleep mode of operation by asserting a sleep signal.

With the foregoing general description of the device 10 in mind, it has been recognized that the array 12, power monitoring circuitry 18 and input buffers 20 each include circuitry that, during operation of the device 10, utilizes current to a degree that is undesirable in a number of applications. The device 10 includes circuitry that, in response to the sleep signal, reduces this undesirable current consumption by disabling circuitry in the noted portions of the device 10 that are consuming current. However, before describing the circuitry that disables the current consuming circuitry, the components and operation of the array 12, power monitoring circuitry 18 and input buffers 20 will be described as well as the components therein that are disabled in response to the sleep signal.

Figure 2:
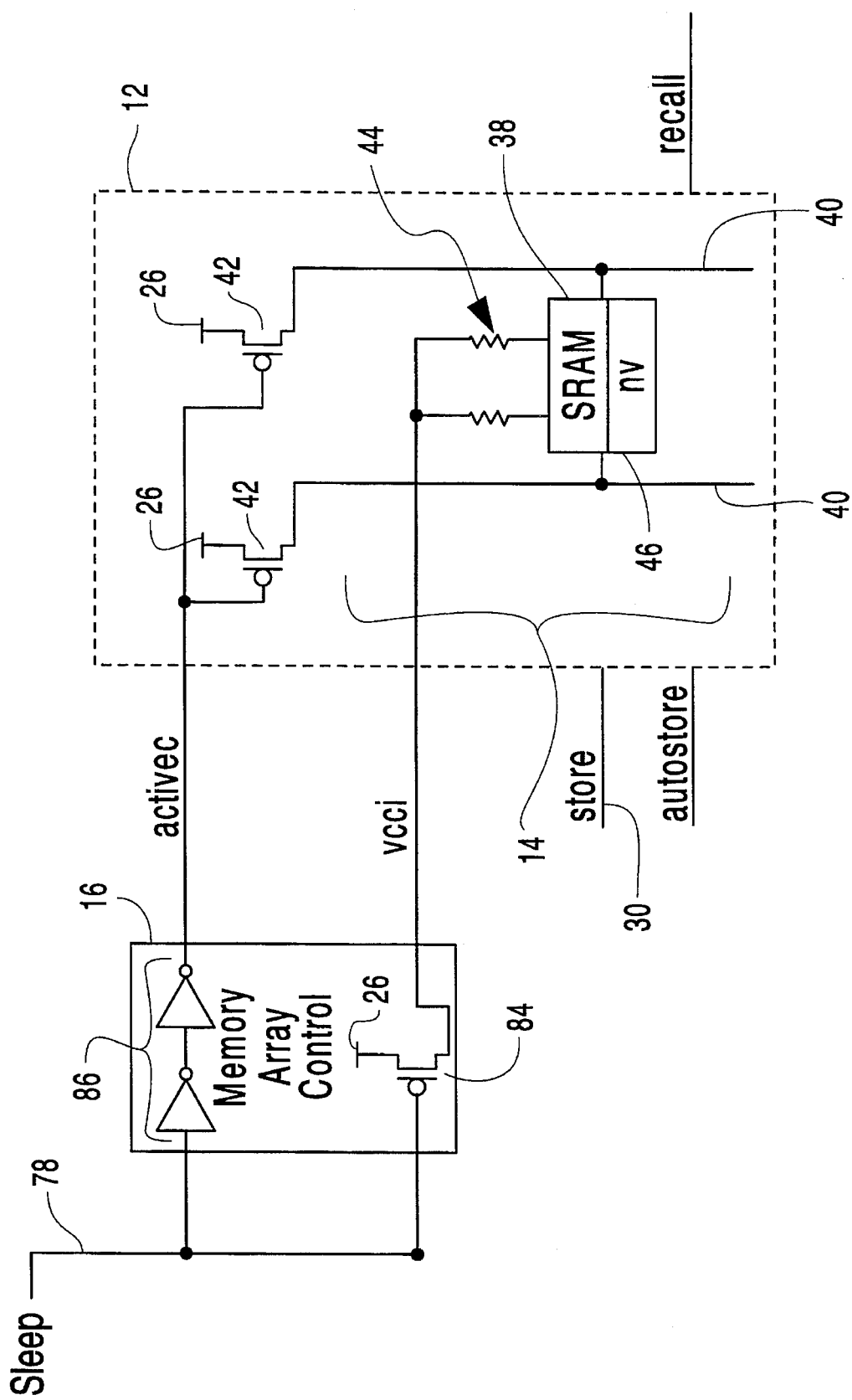
FIG. 2 is a schematic diagram of a first portion of the embodiment of the invention illustrated in FIG. 1, including memory cells having memory cell loads and bit lines.

As previously discussed, the array 12 includes a plurality of the cell 14. With reference to FIG. 2, each cell 14 includes a volatile static random access memory (SRAM) portion 38 that is capable of receiving a bit of data from an exterior environment, retaining this bit of data and transmitting this bit of data bit back to the exterior environment. The transfer of a bit of data between the SRAM portion 38 and the exterior environment is accomplished using bit lines 40. The loads 44 are operative for supplying power to the SRAM portion 38 which, in turn, is operative for driving the bit lines 40. Due to its volatile characteristic, the SRAM portion 38 will lose the retained bit of data whenever power is removed therefrom. The bit lines 40 and loads 44 are both significant current sinks that have time constants appreciably greater than the normal address access time of the device 10 and which are disabled during sleep mode.

Each cell 14 also includes a nonvolatile portion 46 that is connected to the SRAM portion 38 so that the data retained within the SRAM portion can be transferred to the nonvolatile portion 46 in response to a store signal that initiates a store cycle. Similarly, the data stored within the nonvolatile portion 46 can be transferred back to the SRAM portion 38 in response to a recall signal that initiates a recall cycle.

Figure 3:
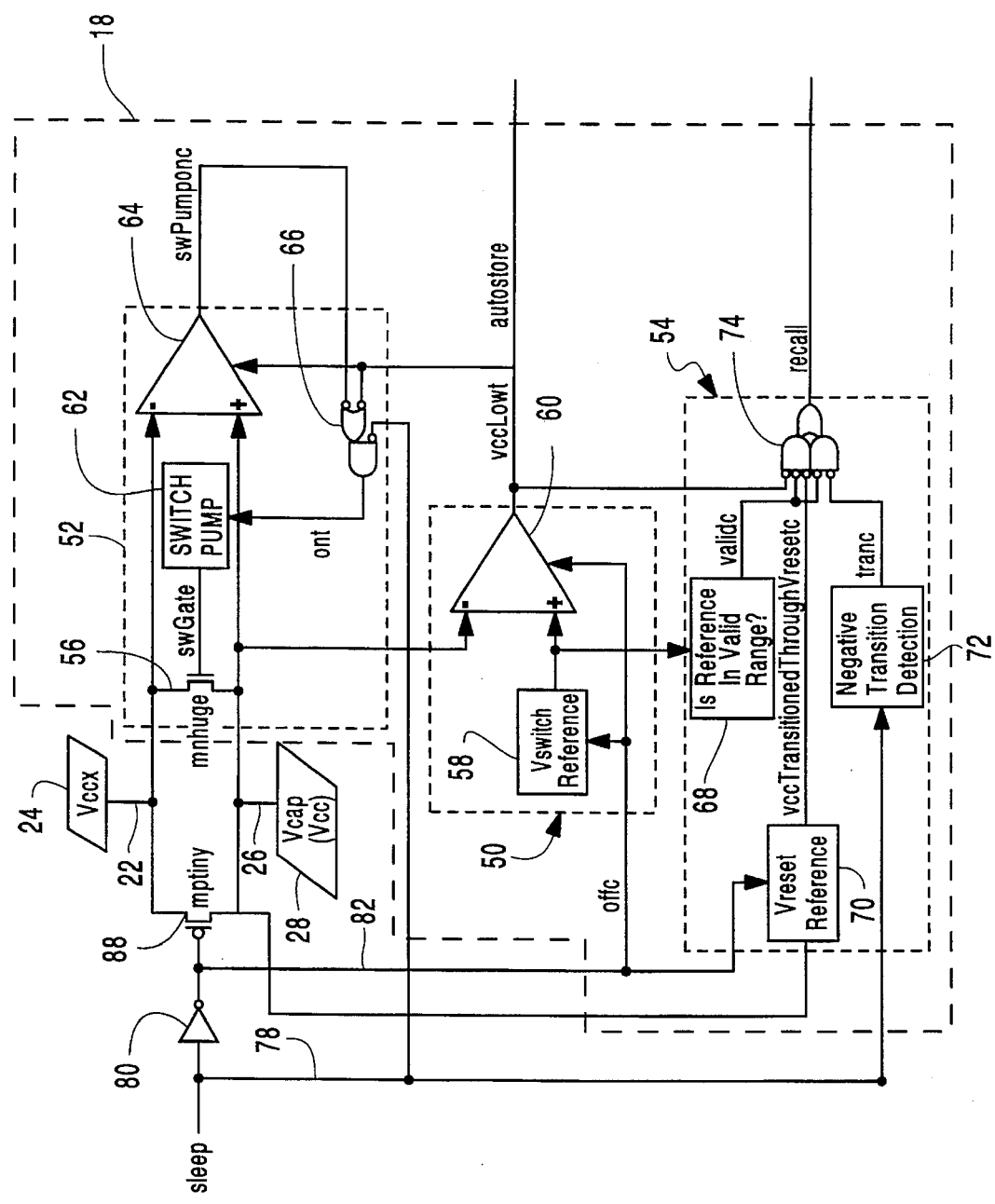
FIG. 3 is a schematic diagram of a second portion of the embodiment of the invention illustrated in FIG. 1, including circuitry for initiating an automatic store operation in response to a loss of system power and an automatic recall operation in response to a restoration of said power.

FIG. 3 illustrates the power monitoring circuitry 18 for monitoring the status of power that is being supplied to device 10. The power monitoring circuitry 18 is capable of initiating a store cycle whenever a loss of system power is detected and a recall cycle whenever a restoration of system power is detected after a loss of power has occurred. As shown in FIG. 3, the circuitry 18 is separated into a power down monitoring circuitry 50 for determining when there has been a loss of power that prevents reliable operation of the SRAM portion 38 of the cells 14 in the array 12 and generating a store signal indicative thereof that causes data retained in the SRAM portion to be transferred to the nonvolatile portion using capacitor backup power; an isolation switch circuitry 52 that disconnects the device 10 from the power supply 24 in response to the signal produced by the power down monitoring circuitry 50 and connects the device 10 to the power supply 24 in response to a restoration of power; and power up monitoring circuitry 54 for determining when adequate power is present for SRAM operations and generating a signal indicative thereof that is used to initiate a recall operation. All three of these sub-circuits include current sinking elements which are disabled during sleep mode and which have time constants appreciably greater than the normal address access time of the device 10.

As illustrated in FIG. 3, isolation switch circuitry 52 includes a relatively large n-channel MOSFET 56 operatively connected between power supply 24 and external capacitor 28 for connecting and disconnecting device 10 from power supply 24. An n-channel MOSFET is used to avoid the occurrence of a destructive condition known as latch-up when powering up device 10. During normal operation, the n-channel MOSFET 56 is biased "on" creating a relatively low resistance between power supply 24 and external capacitor 28. This allows capacitor 28 to charge up to substantially the same voltage as power supply 24, which in the preferred embodiment is 5 volts.

With reference to FIG. 3, power down monitoring circuitry 50 includes reference voltage source 58 and differential amplifier 60. The negative input terminal of differential amplifier 60 is operatively connected to external capacitor 28 and the positive input terminal is operatively connected to the output of reference voltage source 58. When enabled, reference voltage source 58 outputs a regulated reference voltage at a level somewhere between zero volts and the voltage level applied at power input 22. When disabled, reference voltage source 58 outputs an unregulated voltage substantially equal to the voltage applied at power input 22. In the preferred embodiment, the voltage level applied at power input 22 is 5 volts and the regulated reference voltage level is 4.2 volts.

Differential amplifier 60, when enabled, compares the voltage across capacitor 28 to the regulated reference voltage and creates an output signal whenever the reference voltage is greater. This output signal is indicative of a loss of power from power supply 24 and is used by device 10 to initiate a store cycle. Reference voltage source 58 and differential amplifier 60 are both significant current sinks that have time constants appreciably greater than the normal address access time of the device 10 and that are disabled during sleep mode.

Isolation switch circuitry 52 monitors the output of power down monitoring circuitry 50, and, when a signal is detected which indicates a loss of power from the power supply 24, compares the voltage of power supply 24 to the voltage across external capacitor 28. If the voltage across capacitor 28 is greater, the isolation switch circuitry 52 isolates device 10 from power supply 24 by turning off n-channel MOSFET 56. Device 10 then uses the charge stored in external capacitor 28 to complete the store cycle initiated by the output signal of power down monitoring circuitry 50. Device 10 is isolated from power supply 24 to ensure that the charge stored in capacitor 28 is not lost through an extraneous path created by the failure of supply 24.

As illustrated in FIG. 3, isolation switch circuitry 52 includes n-channel MOSFET 56, switch pump 62, differential amplifier 64, and logic circuitry 66. Switch pump 62 is operatively connected to the gate terminal of n-channel MOSFET 56 for applying an elevated voltage level to its gate terminal whenever a relatively low resistance is required between power supply 24 and device 10, i.e., whenever adequate power is being delivered to device 10. Switch pump 62 is required because the application of a logic high signal to the gate of n-channel MOSFET 56, rather than the elevated voltage level produced by the switch pump 62, results in a voltage drop between power supply 24 and external capacitor 28 which is undesirable. Differential amplifier 64 is operatively connected at its negative input terminal to power supply 24 and at its positive input terminal to external capacitor 28 for creating an output signal indicative of whether the capacitor voltage is greater than the supply voltage. Differential amplifier 64 is also operatively connected at an enable input to the output of power down monitoring circuitry 50. Logic circuitry 66 is responsive to the output signal of differential amplifier 64 and the output signal of power down monitoring circuitry 50 for determining when n-channel MOSFET 56 should be turned on and off and for communicating this information to switch pump 62.

After there has been a loss of power and device 10 has been isolated from power supply 24, differential amplifier 64 continues to compare the voltage of power supply 24 to that across external capacitor 28. When the power from supply 24 is restored, differential amplifier 64 outputs a signal indicative of this restoration. Logic circuitry 66 detects this signal from differential amplifier 64 and signals switch pump 62 to turn on n-channel MOSFET 56, thereby reconnecting power supply 24 to external capacitor 28 and charging up the capacitor. The power down monitoring circuitry 50 detects that the voltage across capacitor 28 has exceeded the regulated reference voltage and produces an output signal indicative of such. Differential amplifier 64 detects this signal from the power down monitoring circuitry 50 and stops comparing the supply voltage to the capacitor voltage. Both switch pump 62 and differential amplifier 64 are current sinks that have time constants appreciably greater than the normal address access time of the device 10 and that are disabled during sleep mode.

The power up monitoring circuitry 54 is responsible for initiating recall cycles. A recall cycle is generally required when power has been restored to device 10 after a power down condition or when device 10 has emerged from a sleep cycle. To initiate a recall cycle after power has been restored to device 10, three conditions must be met. First, power up monitoring circuitry 54 must determine whether there is a signal present at the output of power down monitoring circuitry 50. If a signal is present, this indicates that system power has not yet been restored and therefore a recall cycle should not be initiated. Power up monitoring circuitry 54 must also determine whether the voltage across external capacitor 28 had dropped a certain predetermined amount below the reference voltage of reference voltage source 58 before power was restored. If the capacitor voltage had not dropped below that level, then the data stored within the SRAM portion 46 of the memory was not lost and a recall cycle is not required. Lastly, power up monitoring circuitry 54 must determine whether power down monitoring circuitry 50 is sufficiently stabilized before it may initiate a recall cycle.

To initiate a recall cycle after device 10 has emerged from sleep mode, three conditions must be met. First, power up monitoring circuitry 54 must determine that device 10 is no longer in sleep mode. Second, power up monitoring circuitry 54 must determine that the regulated reference voltage being output by reference voltage source 58 has sufficiently stabilized. Third, power up monitoring circuitry 54 must determine that adequate operating power is available.

In the preferred embodiment, as illustrated in FIG. 3, power up monitoring circuitry 54 includes stabilization circuitry 68, voltage reset circuitry 70, negative transition detection circuitry 72, and logic circuitry 74. Stabilization circuitry 68 monitors the output of reference voltage source 58 to determine whether it has stabilized within a specific voltage range. If the voltage has stabilized within the specific range, stabilization circuitry 68 outputs a signal indicative of such. Voltage reset circuitry 70 monitors the voltage across external capacitor 28 and determines whether this voltage has dropped a certain amount below the reference voltage of reference voltage source 58 before system power was restored. If the voltage had dropped the required amount, voltage reset circuitry 70 outputs a signal indicative of such. Negative transition detection circuitry 72 determines when device 10 is just leaving a sleep mode and outputs a signal indicative of such. Logic circuitry 74 is responsive to the output signals of power down monitoring circuitry 50, voltage reset circuitry 70, and stabilization circuitry 68 for initiating a recall cycle after power has been restored to device 10 after a power down condition. Similarly, logic circuitry 74 is responsive to the output signals of stabilization circuitry 68 and negative transition detection circuitry 72 for initiating a recall cycle after device 10 has emerged from sleep mode. Voltage reset circuitry 70 is a significant current sink that has a time constant appreciably greater than the normal address access time of the device 10 and is disabled during sleep mode.

Figure 4:
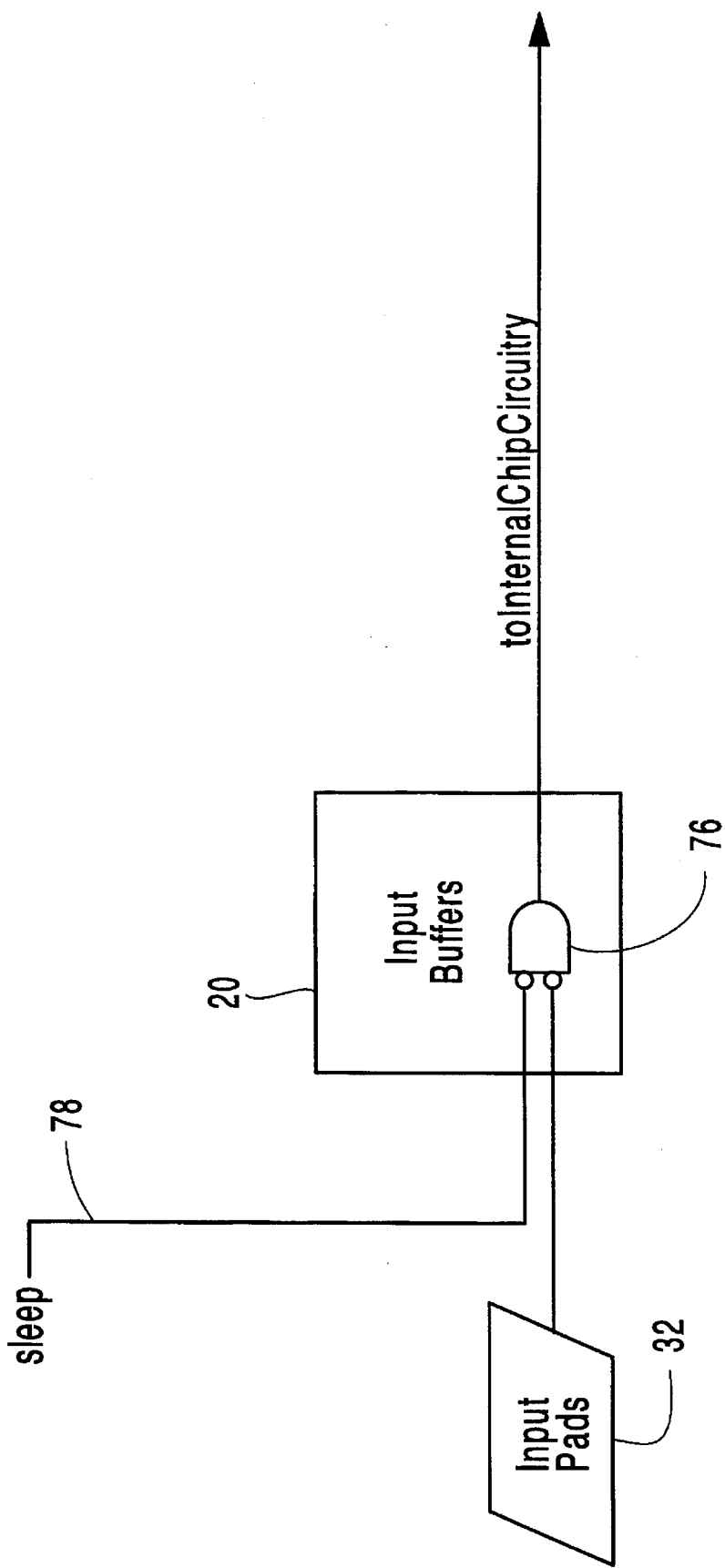
FIG. 4 is a schematic diagram of a third portion of the embodiment of the invention illustrated in FIG. 1, including input buffers for buffering data transmitted into the memory device.

With reference to FIG. 4, device 10 includes one or more input buffers 20 for receiving data, such as clock signals, addresses, and user input data, from an exterior environment and transferring this data to the internal circuitry of device 10. Input buffers are used by a memory device so that the device itself does not influence the circuit which is delivering data to the device. As seen in the figure, the invention uses a NOR gate 76 as an input buffer. NOR gate 76 has a first input operatively connected to an input pad 32 for receiving data from the exterior environment and an output for delivering the data to the internal circuitry of device 10. The input buffers 20 are significant current sinks if the input signals being applied to them are at an intermediate level between power supply and ground and are disabled during sleep mode. The input buffers, however, have a time constant within a factor of two of the normal address access time of the device 10.

With the foregoing description of the components and operation of the array 12, power monitoring circuitry 18 and input buffers 20 in mind, the circuitry that disables, in response to a sleep signal, the current consuming components of the above portions will be described.

In the preferred embodiment, as illustrated in FIG. 1, device 10 includes an active high sleep signal line 78 communicating with an exterior environment through sleep input 34. This signal line will be logic high when device 10 is in sleep mode and logic low otherwise. Device 10 also includes inverter 80 connected at an input to active high sleep signal line 78 for providing an active low sleep signal line 82 at an output. Active low sleep signal line 82 will be logic low when device 10 is in sleep mode and logic high otherwise. The invention uses these two signal lines to disable the various current sinking elements when in sleep mode.

Memory loads 44 are known to sink current whenever a voltage is applied to them. Device 10 provides circuitry for removing the voltage from the memory cell loads 44 whenever a sleep signal is asserted. In one embodiment, as illustrated in FIG. 2, this circuitry comprises logic gate 84 in memory array control 16 operatively connected at an output to memory loads 44 in memory array 12 and responsive to active high sleep signal line 78 connected at an input for disconnecting the memory loads 44 from a source of power 26 whenever a sleep signal is asserted. It should be appreciated that logic gate 84 can include any means for terminating the application of a voltage to the loads 44 in response to a sleep signal and is not limited to the specific means illustrated in FIG. 2. In another embodiment, the memory loads 44 are held at substantially the same voltage as the underlying substrate in response to a sleep signal.

Whenever the voltage being supplied to the memory loads 44 is terminated, any data stored in the SRAM portion 38 of the cell 14 will be lost. To prevent this loss from occurring, the preferred embodiment of the present invention allows a user to initiate a store cycle, using store input 30, before entering sleep mode. In an alternative embodiment, the store cycle may be initiated automatically by device 10 whenever a sleep signal is asserted on active high sleep signal line 78.

Bit lines 40 are used by device 10 to carry data bits between SRAM portion 38 and the exterior environment. When a voltage that is different from the voltage of the underlying substrate is present on one of these bit lines, a semiconductor junction is reverse biased and a small leakage current to the underlying substrate will result. This leakage current is generally negligible if only one or a few bit lines are involved, but can represent a significant current sink for memories having larger arrays. Device 10 provides circuitry for significantly reducing the difference between the voltage on the bit lines and the voltage on the underlying substrate in response to a sleep signal. This effectively eliminates the reverse junction leakage current during sleep mode. In one embodiment, as illustrated in FIG. 2, the circuitry comprises logic gates 86 in memory array control 16 having an output operatively connected to the gate terminals of bit line bias transistors 42 located within memory array 12. During normal operation, the bit line bias transistors 42 are biased "ON", thereby resistively connecting the bit lines 40 to a source of power 26. During sleep mode, the bit line bias transistors 42 are turned "OFF", thereby isolating the bit lines 40 from the source of power 26 and allowing a "zero junction bias" condition to develop at the corresponding semiconductor junctions. In a preferred embodiment, the bit lines 40 are held at the same voltage level as the underlying substrate in response to a sleep signal which also creates a "zero junction bias" condition at the corresponding semiconductor junctions.

Device 10 provides circuitry for disabling the entire power down monitoring circuitry 50 in response to a sleep signal. This is accomplished by connecting the active low sleep signal line 82 to the enable inputs of both reference voltage source 58 and differential amplifier 60. This arrangement causes the application of a logic low signal to the enable inputs whenever device 10 is in sleep mode, thereby disabling the two current sinking elements.

Device 10 also includes circuitry for disabling the entire isolation switch circuitry 52 in response to a sleep signal. As illustrated in FIG. 3, logic circuitry 66 is connected at an enable input port to active high sleep signal line 78 for disabling this circuitry whenever a sleep signal is asserted. When logic circuitry 66 is disabled, a logic low signal is output to switch pump 62 disabling it. When switch pump 62 is disabled, n-channel MOSFET 56 will be turned off. Differential amplifier 64 is connected at an enable input to the output of power down monitoring circuitry 50. Because power down monitoring circuitry 50 is disabled during sleep mode, its output signal will be low and will thereby disable differential amplifier 64.

Because n-channel MOSFET 56 is turned off during sleep mode to eliminate the current sink created by switch pump 62, a device is provided for maintaining the connection of device 10 to power supply 24 during sleep mode. The preferred embodiment of the present invention includes p-channel MOSFET 88 to accomplish this task. P-channel MOSFET 88 is connected with its drain and source terminals between power supply 24 and external capacitor 28. The gate terminal of p-channel MOSFET 88 is connected to active low sleep signal line 82. As a result, p-channel MOSFET 88 will only be turned on when device 10 is in sleep mode. Because the amount of current p-channel MOSFET 88 will be required to conduct during sleep mode is small compared to the current drawn during the active and standby modes, the transistor can be relatively small and the threat of latch-up occurring is greatly abated. Current limiting means, such as a resistor, may also be provided in series with the drain or source terminal of p-channel MOSFET 88 to further limit the current through the device during power up to reduce the risk of latch-up.

In addition, device 10 includes circuitry for disabling certain current sinking elements of power up monitoring circuitry 54 in response to a sleep signal. The active low sleep signal line 82 is connected to an enable input of voltage reset circuitry 70 for disabling this circuitry whenever device 10 is in sleep mode. Also, logic circuitry 74 will be disabled whenever device 10 is in sleep mode because reference voltage source 58 will be disabled and its output voltage will not be stabilized within the proper range required by stabilization circuitry 68. Stabilization circuitry 68 will output a signal indicative of this condition which will disable logic circuitry 74. In the preferred embodiment of the present invention, stabilization circuitry 68 and negative transition detection circuitry 72 will not be disabled during sleep mode because they are designed to avoid sinking current whenever their inputs are disabled.

Device 10 also includes circuitry for disabling the input buffers 20. As illustrated in FIG. 4, the input buffers 20 are comprised of at least one NOR gate 76 having a first and second input and an output. The first input of NOR gate 76 is operative for receiving data from an exterior environment, while the second input is responsive to active high sleep signal line 78 operatively connected thereto. The output of NOR gate 76 is operatively connected to circuitry internal to device 10 for delivering the data received by the first input to the internal circuitry whenever NOR gate 76 is enabled. The NOR gate 76 will be disabled, and therefore will not deliver data to the internal circuitry, whenever a sleep signal is asserted on active high sleep signal line 78. Once the NOR gate 76 is disabled, it will not sink current even when the voltage applied at its first input is at an intermediate state between logic high and logic low.

The operation of the preferred embodiment of the present invention will now be described. In general, device 10 has three distinct modes of operation; namely, normal operating mode, sleep mode, and power down mode. Normal operating mode is the mode during which SRAM portion 38 is capable of performing all of its designed functions, including reading and writing data to and from an exterior environment and executing store and recall cycles. During this mode, adequate power is being supplied to device 10 and active high sleep signal line 78 is logic low. As previously discussed, sleep mode is entered by applying a logic high signal to sleep input 34 which results in the disabling of current sinking elements internal to device 10. Sleep mode should only be entered from normal operating mode. Power down mode is entered whenever the power being supplied to device 10 is terminated or sufficiently reduced. Power down mode can only be entered from the normal operating mode because the circuitry which triggers this mode is disabled during sleep mode. The operation of device 10 during power down mode was discussed previously.

During normal operating mode, active high sleep signal line 78 will be logic low indicating that device 10 is not in sleep mode. N-channel MOSFET 56 will be biased on, providing a relatively low resistance between power supply 24 and external capacitor 28. External capacitor 28 will be charged up to a voltage approximately equal to the voltage of supply 24, which in the preferred embodiment is 5 volts. Power down monitoring circuitry 50 will be enabled by active low sleep signal line 82 and will compare the voltage across capacitor 28 to the voltage of reference voltage source 58 which in the preferred embodiment is 4.2 volts. Because the capacitor voltage is greater, power down monitoring circuitry 50 will output a logic low signal, thereby disabling differential amplifier 64 in FIG. 3. Logic circuitry 66 will be enabled by active high sleep signal line 78 and will signal switch pump 62 to keep n-channel MOSFET 56 biased on as long as the output of power down monitoring circuitry 50 is logic low.

During normal operating mode, memory loads 44 will be connected to power source 26. Similarly, the bit lines 40 will be connected to power source 26. Memory cell 14 will be fully capable during this mode of reading and writing data to and from an exterior environment over the bit lines 40. Also during normal operating model active high sleep signal line 78 will enable the input buffers 20 to pass data from the exterior environment into device 10.

While in normal operating mode, a user may decide to place device 10 into sleep mode to cut down on current consumption. A user will normally make this decision after a period of inactivity on the part of device 10 and in anticipation of further inactivity in the near future. When a user desires to place device 10 into sleep mode, he simply applies a logic high signal to active high sleep signal line 78 through exterior sleep input 34. If the user wants to protect the data stored in the SRAM portion 38 of the memory before entering sleep mode, he must first deliver a store signal to device 10 through exterior store input 30. Device 10 will then transfer the data from the SRAM portion 38 to the nonvolatile portion 46 before entering sleep mode.

Once the device is placed in sleep mode, the various current sinking elements will be disabled by the signals on sleep lines 78 and 82. Power down monitoring circuitry 50 will be disabled and will have an output voltage of zero. This output voltage will disable differential amplifier 64 of isolation switch circuitry 52. Logic circuitry 66 will be disabled, which in turn disables switch pump 62 and turns off n-channel MOSFET 56. P-channel MOSFET 88 will be turned on by active low sleep signal line 82, providing a continuous supply of power to device 10 during sleep mode. Voltage reset circuitry 70 is disabled as well as logic circuitry 74 in the power up monitoring circuitry 54. Because all of these current sinking elements are disabled, device 10 will not be able to monitor system power, initiate a store cycle on power down, or initiate a recall cycle on power up during sleep mode.

As a result of the signal on active high sleep signal line 78 becoming logic high, logic gate 84 in FIG. 2 will disconnect the memory cell loads 44 from a source of power 26. Because of this, all data stored in the SRAM portion 38 of device 10 will be lost and the SRAM portion 38 will not be able to read and write to and from an exterior environment during sleep mode. The SRAM data will be retained in nonvolatile portion 46, however, as long as a store cycle was completed prior to entering sleep mode.

Also as a result of the signal on active high sleep signal line 78 becoming logic high, the bit line bias transistors 42 will disconnect the bit lines 40 from the source of power 26. These bit lines are not needed during sleep mode because no data will be flowing into or out of memory cell 14 during this time.

Lastly, input buffers 20 will be disabled in response to the signal on sleep signal line 78. These buffers are not needed during sleep mode because no data will be coming into device 10 during this time.

When a user wants to leave the sleep mode, he simply applies a logic low signal to active high sleep signal line 78 through exterior sleep input 34. This will reactivate all of the disabled elements, and, after a turn on delay period, allow the device to again be used to read and write to and from the exterior environment. Power up monitoring circuitry 54 will automatically initiate a recall cycle once the logic low signal is applied to active high sleep signal line 78, the output voltage of reference voltage source 58 has stabilized, and power being delivered to device 10 is adequate. After the recall cycle is completed, device 10 is once again in normal operating mode. The time it takes for device 10 to be ready to read and write data after sleep mode is terminated will be appreciably longer than the normal address access time of the device 10, which in the preferred embodiment is 25 nanoseconds.

It should be appreciated that the present invention is not limited to use with nvSRAMS and is applicable to other types of memory devices, such as ROMs and other types of RAMs. It should also be appreciated that certain alternatives exist which are considered to be within the purview of the present invention. One such alternative uses software to place device 10 into sleep mode by delivering a predetermined sequence of addresses to device 10. Device 10 recognizes the sequence and enters sleep mode accordingly. Sleep mode is terminated by applying a signal to a reset pin. Another alternative takes a modular approach by using a general purpose instruction bus to instruct device 10 to enter sleep mode. The bus is capable of delivering a plurality of instructions to device 10, including an instruction to enter sleep mode. The instruction on the bus is decoded by the different individual circuits within device 10 which enters sleep mode whenever the sleep instruction is received.

Although the present invention has been described in conjunction with its preferred embodiment, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A nonvolatile static random access memory (nvSRAM) device having a sleep mode, comprising:
    a nonvolatile static random access memory cell, having:
        a static random access memory (SRAM) portion which will lose any data located therein if power is removed; and
        a nonvolatile portion which will retain any data located therein if power is removed;
        wherein said nonvolatile portion is operatively connected to said SRAM portion for transferring a bit of data from said SRAM portion to said nonvolatile portion in response to a store signal and for transferring a bit of data from said nonvolatile portion to said SRAM portion in response to a recall signal;
    means for monitoring power being provided to the device and for generating a store signal upon detecting a loss of power and a recall signal upon detecting a restoration of power, wherein said means for monitoring power includes circuitry that consumes power; and
    means, in response to a sleep signal, for disabling at least a portion of said circuitry in said means for monitoring power to reduce power consumption.

2. A nonvolatile static random access memory device, as claimed in claim 1, wherein:
    said means for monitoring power includes means for determining whether there has been a loss of power and generating said store signal when there has been a loss of power, wherein said means for determining consumes power; and
    said means for disabling includes means for reducing the power consumed by said means for determining.

3. A nonvolatile static random access memory device, as claimed in claim 2, wherein:
    said means for determining includes a first differential amplifier for comparing the voltage provided by a reference voltage source to a voltage being provided to the device, wherein at least one of said first differential amplifier and said reference voltage source consumes power; and
    wherein said means for disabling includes means for reducing the power consumed by at least one of the following: said reference voltage source and said first differential amplifier in response to said sleep signal.

4. A nonvolatile static random access memory device, as claimed in claim 1, wherein:
    said means for monitoring power includes means for isolating the device from an external power supply if there is a loss of system power, wherein said means for isolating consumes power; and
    said means for disabling includes means for reducing the power consumed by said means for isolating.

5. A nonvolatile static random access memory device, as claimed in claim 4, wherein:
    said means for isolating includes:
        a MOSFET for selectively connecting the device to an external power supply and disconnecting the device from an external power supply whenever there is a loss of power; and
        switch pump means, operatively connected to a gate terminal of said MOSFET, for increasing in magnitude the voltage provided to said gate terminal of said MOSFET when the device is connected to the external power supply, wherein said switch pump means consumes power;
    wherein said means for disabling includes means for reducing the power consumed by said switch pump.

6. A nonvolatile static random access memory device, as claimed in claim 5, wherein:
    said means for isolating includes a second differential amplifier for detecting whether power has been restored, after there has been a loss of power, and for turning on said MOSFET in response to said restoration, wherein said second differential amplifier consumes power; and said means for disabling includes means for reducing the power consumed by said second differential amplifier.

7. A nonvolatile static random access memory device, as claimed in claim 1, wherein:

said means for monitoring power includes means for determining whether power is adequate for operation of said SRAM portion after there has been an absence of power and for generating a recall signal, wherein said means for determining consumes power; and said means for disabling includes means for reducing the power consumed by said means for determining whether power is adequate.

8. A nonvolatile static random access memory device, as claimed in claim 7, wherein:

said means for determining whether power is adequate includes circuitry for determining whether the voltage across an input capacitor has dropped a specified amount below a reference voltage, wherein said circuitry for determining consumes power; and said means for disabling includes means for reducing the power consumed by said circuitry for determining.

9. A nonvolatile static random access memory device, as claimed in claim 8, wherein:

said means for determining further includes circuitry for determining whether a reference voltage source has stabilized at its proper output operating level;

wherein said means for determining creates said recall signal whenever said reference voltage source has stabilized, said capacitor voltage has dropped said specified amount below said reference voltage, and said power is adequate for operation of said SRAM portion.

10. A nonvolatile static random access memory device, as claimed in claim 9, wherein:

said means for determining further includes circuitry for detecting the termination of said sleep signal;

wherein said means for determining will create a recall signal whenever termination of said sleep signal is detected, said reference voltage source has stabilized and said power is adequate for operation of said SRAM portion.

11. A nonvolatile static random access memory device, as claimed in claim 1, further comprising:

a p-channel MOSFET for selectively connecting and disconnecting the device and an external power supply, said p-channel MOSFET including a gate terminal that, in response to said sleep signal, connects the device and the external power supply.

12. A nonvolatile static random access memory device, as claimed in claim 11, further comprising:

current limiting means, connected in series with said p-channel MOSFET, for limiting the current through said p-channel MOSFET during power up.

13. A nonvolatile static random access memory device, as claimed in claim 12, wherein:

said current limiting means includes a resistor.

14. A nonvolatile static random access memory device having a sleep mode, comprising:

a nonvolatile static random access memory cell, having:

a static random access memory (SRAM) portion that is capable of receiving a bit of data from an exterior environment, retaining said bit of data, and transmitting said bit of data back to said exterior environment, wherein a bit of data will not be retained if power is removed; and a nonvolatile portion operatively connected to said SRAM portion for transferring a bit of data from said SRAM portion to said nonvolatile portion in response to a store signal and transferring a bit of data from said nonvolatile portion to said SRAM portion in response to a recall signal, wherein a bit of data retained in said nonvolatile portion will be retained if power is removed;

means for facilitating at least one of receiving, transmitting, storing and recalling data, said means for facilitating consuming power and having a relatively high time constant; and means, in response to a sleep signal, for disabling said means for facilitating to reduce power consumption.

15. A nonvolatile static random access memory device, as claimed in claim 14, wherein:

said means for facilitating includes a memory load that is operatively connected to said nonvolatile static random access memory cell; and said means for disabling includes means for disconnecting said memory load from a source of power in response to said sleep signal.

16. A nonvolatile static random access memory device, as claimed in claim 14, wherein:

said means for facilitating includes a memory load that is operatively connected to said nonvolatile static random access memory cell; and said means for disabling includes means for holding said memory load at substantially the same voltage as an underlying substrate in response to a sleep signal.

17. A nonvolatile static random access memory device, as claimed in claim 14, wherein:

said means for facilitating includes a bit line that is operatively connected to said nonvolatile static random access memory cell and that provides a pathway for transmitting and receiving data between said SRAM portion and the exterior environment; and said means for disabling includes means for disconnecting said bit line from a source of power in response to said sleep signal.

18. A nonvolatile static random access memory device, as claimed in claim 14, wherein:

said means for facilitating includes a bit line that is operatively connected to said nonvolatile static random access memory cell and that provides a pathway for transmitting and receiving data between said SRAM portion and the exterior environment; and said means for disabling includes means for holding said bit line at substantially the same voltage as an underlying substrate in response to a sleep signal.

19. A nonvolatile static random access memory device, as claimed in claim 14, wherein:

said means for facilitating includes power monitoring circuitry for monitoring whether there has been a loss of power to the device, and generating a store signal indicative of said loss of power.

20. A nonvolatile static random access memory device, as claimed in claim 14, wherein:

said means for facilitating includes isolation switch circuitry for isolating the device from an external power supply whenever there is a loss of power.

21. A nonvolatile static random access memory device, as claimed in claim 14, wherein:

said means for facilitating includes power up detection circuitry for determining whether system power has been restored after an absence of power and for generating a recall signal whenever restoration of system power is detected.

22. A nonvolatile static random access memory device having a sleep mode, comprising:

a nonvolatile static random access memory (nvSRAM) cell having:

a static random access memory (SRAM) portion for receiving a bit of data from an exterior environment, retaining said bit of data, and transmitting said bit of data back to said exterior environment, wherein a retained bit of data will be lost if power is removed; and a nonvolatile portion operatively connected to said SRAM portion for transferring a bit of data from said SRAM portion to said nonvolatile portion in response to a store signal and for transferring a bit of data from said nonvolatile portion to said SRAM portion in response to a recall signal, wherein a bit of data retained in said nonvolatile portion will not be lost if power is removed;

input buffer means for receiving data from said exterior environment and for sending said data to circuitry internal to said nvSRAM device, wherein said input buffer means consumes power; and means, in response to a sleep signal, for disabling said input buffer means to reduce power consumption.

23. A nonvolatile static random access memory device, as claimed in claim 22, wherein:

said data includes addresses, clock signals, and user input data.

24. A nonvolatile static random access memory device, as claimed in claim 22, wherein:

said means for disabling comprises a NOR gate with one input responsive to said sleep signal so that said NOR gate is disabled when said sleep signal is present.

25. A semiconductor memory device having a sleep mode, comprising:

a memory capable of retaining a bit of data and transmitting said bit of data to an exterior environment, wherein said memory consumes power during a standby mode;

wherein said memory includes at least one bit line which consumes power through undesirable junction leakage whenever the voltage on said bit line is substantially different from the voltage on an underlying substrate; and means for reducing, relative to said standby mode, the power consumed by said memory in response to a sleep signal;

wherein said means for reducing power consumption includes means for holding said bit line at substantially the same voltage as said underlying substrate in response to said sleep signal.

26. A semiconductor memory device having a sleep mode, comprising:

a memory capable of retaining a bit of data and transmitting said bit of data to an exterior environment, wherein said memory consumes power during a standby mode;

wherein said memory includes at least one bit line which consumes power through undesirable junction leakage whenever the voltage on said bit line is substantially different from the voltage on an underlying substrate; and means for reducing, relative to said standby mode, the power consumed by said memory in response to a sleep signal;

wherein said means for reducing power consumption includes means for disconnecting said bit line from a source of power in response to said sleep signal.

27. A semiconductor memory device having a sleep mode, comprising:

a memory capable of retaining a bit of data and transmitting said bit of data to an exterior environment, wherein said memory consumes power during a standby mode;

wherein said memory includes at least one memory load which consumes power whenever a voltage drop exists across it; and means for reducing, relative to said standby mode, the power consumed by said memory in response to a sleep signal;

wherein said means for reducing power consumption includes means for holding said memory load at substantially the same voltage as said underlying substrate in response to said sleep signal.

28. A semiconductor memory device having a sleep mode, comprising:

a memory capable of retaining a bit of data and transmitting said bit of data to an exterior environment, wherein said memory consumes power during a standby mode;

wherein said memory includes at least one memory load which consumes power whenever a voltage drop exists across it; and means for reducing, relative to said standby mode, the power consumed by said memory in response to a sleep signal;

wherein said means for reducing power consumption includes means for disconnecting said memory load from a source of power in response to said sleep signal.

29. A semiconductor memory device having a sleep mode, comprising:

a memory capable of retaining a bit of data and transmitting said bit of data to an exterior environment, wherein said memory consumes power during a standby mode;

wherein said memory includes at least one input buffer which consumes power whenever an input voltage at an intermediate level between power supply and ground is applied to said at least one input buffer; and means for reducing, relative to said standby mode, the power consumed by said memory in response to a sleep signal;

wherein said means for reducing power consumption includes means for disabling said input buffer in response to said sleep signal.

30. A nonvolatile static random access memory (nvSRAM) device having a sleep mode, comprising:

a nonvolatile static random access memory cell, having:

a static random access memory (SRAM) portion which will lose any data located therein if power is removed; and a nonvolatile portion which will retain any data located therein if power is removed;

wherein said nonvolatile portion is operatively connected to said SRAM portion for transferring a bit of data from said SRAM portion to said nonvolatile portion in response to a store signal and for transferring a bit of data from said nonvolatile portion to said SRAM portion in response to a recall signal;

means for determining whether there has been a loss of power and generating said store signal when there has been a loss of power, wherein said means for determining whether there has been a loss of power consumes power;

means for isolating the device from an external power supply if there is a loss of system power, wherein said means for isolating consumes power;

means for determining whether power is adequate for operation of said SRAM portion after there has been an absence of power and for generating a recall signal, wherein said means for determining whether power is adequate consumes power;

a memory load operatively connected to said nonvolatile static random access memory cell, wherein said memory load consumes power;

a bit line operatively connected to said nonvolatile static random access memory cell and that provides a pathway for transmitting and receiving data between said SRAM portion and the exterior environment, wherein said bit line consumes power;

input buffer means for receiving data from an exterior environment and for sending said data to circuitry internal to said nvSRAM device, wherein said input buffer means consumes power; and means, in response to a sleep signal, for deactivating said means for determining whether there has been a loss of power, said means for isolating, said means for determining whether power is adequate, said memory load, said bit line and said input buffer means to reduce power consumption.

* * * * *